United States Patent [19]
Ito et al.

[11] Patent Number: 5,162,255
[45] Date of Patent: Nov. 10, 1992

[54] METHOD FOR MANUFACTURING A HETERO BIPOLAR TRANSISTOR

[75] Inventors: Takashi Ito, Kawasaki; Toshihiro Sugii, Hadano, both of Japan

[73] Assignee: Fujitsu Limited, Kawasaki, Japan

[21] Appl. No.: 515,443

[22] Filed: Apr. 27, 1990

[30] Foreign Application Priority Data

Apr. 27, 1989 [JP] Japan ................................. 1-108911

[51] Int. Cl.⁵ ............................................. H01L 21/20
[52] U.S. Cl. ..................................... 437/89; 437/100; 148/DIG. 148
[58] Field of Search ................... 437/100, 89; 148/DIG. 148, DIG. 105, DIG. 106

[56] References Cited

U.S. PATENT DOCUMENTS

| | | | |
|---|---|---|---|
| 4,623,912 | 11/1986 | Chang et al. | 357/54 |
| 4,740,483 | 4/1988 | Tobin | 437/242 |
| 4,980,307 | 12/1990 | Ito et al. | 437/235 |

FOREIGN PATENT DOCUMENTS 0025226 2/1983 Japan .

OTHER PUBLICATIONS

Wolf; "Silicon processing for the VLSI era"; 1986; pp. 191–195.

Primary Examiner—Brian E. Hearn
Assistant Examiner—Trung Dang
Attorney, Agent, or Firm—Staas & Halsey

[57] ABSTRACT

A protection layer for protecting a silicon dioxide layer formed on a silicon substrate of a semiconductor device. The protection layer protects the silicon dioxide layer from being reacting with a reactant gas used in a chemical vapor deposition method performed for forming a silicon carbide layer. The silicon carbide layer is to be a wide energy band gap emitter layer of the semiconductor device. The protection layer is formed on the silicon dioxide layer, and the silicon carbide layer is formed in an active region formed on the silicon substrate in an aperture provided by etching the protection layer and the silicon dioxide layer. The protection layer is made of material which is non-reactive with the reactant gas consisting of, for example, trichlorosilane and methane. The protection layer is, for example, titanium nitride formed by a sputtering method, or nitrided silicon oxide formed by heating the silicon dioxide layer.

12 Claims, 9 Drawing Sheets

METHOD FOR MANUFACTURING A HETERO BIPOLAR TRANSISTOR

BACKGROUND OF THE INVENTION

1. Field of the Invention

The present invention relates to a method for manufacturing a semiconductor device, and particularly, for manufacturing a hetero bipolar transistor (HBT) having a wide energy band gap emitter layer made of silicon carbide (SiC).

A bipolar transistor (BPT) is one of the basic elements of a large scale integrated circuit (LSI), and the performance of BPTs in LSIs, such as operation speed and packing density of BPTs has been increased by miniaturizing the size and decreasing the parasitic resistance and capacitance of BPT. During the development, it has been considered that HBT having a wide energy band gap emitter would be more likely to increase performance. However, a stable production of HBTs has not been realized on a silicon (Si) substrate.

2. Description of the Related Art

The inventors of the present invention and others have studied whether SiC is useful for a wide energy band gap emitter of a HBT and have experimentally succeeded forming a wide energy band gap SiC emitter layer on an Si substrate. The result of the study was published by T. sugii, T. Ito, Y. Furumura, M. Doki, F. Mieno and M. Maeda in 1987, under the title of "Si Heterojunction Bipolar Transistors with Single-Crystalline β-SiC Emitter" in J. Electrochem. Soc., Vol. 134, pp 2545-2549, in 1987.

Usually in an LSI, the HBT has planar structure, same as regular BPTs. However, a wide energy band gap SiC emitter layer has a problem in the fabricating process thereof. That is, when an SiC emitter layer is formed on a silicon dioxide ($SiO_2$) layer by a chemical vapor deposition (CVD) method in the atmosphere of a reactant gas consisting of methane ($CH_4$) and trichlorosilane ($SiHCl_3$), a part of the $SiO_2$ layer is deoxidized by $CH_4$, deteriorating an insulation characteristic of the $SiO_2$ layer. Hereupon, the SiC emitter layer is formed by the CVD method with the following chemical reaction:

$$SiHCl_3 + CH_4 \rightarrow SiC + HCl, (1000° C.),$$

wherein, HCl is hydrogen chloride and 1000° C. is a temperature at which the reaction is advanced.

Furthermore, the above reaction is usually performed in a carrier gas of hydrogen ($H_2$) for preventing Si from being oxided. FIG. 1 is a cross sectional view of an SiC layer 6 formed on an Si substrate 1 through an $SiO_2$ layer 3 and is for illustrating a formed result of the SiC layer 31 due to the prior art method of forming an SiC layer. In FIG. 1, the $SiO_2$ layer 3 formed on the Si substrate 1 is partially etched to provide an active region 21 in an aperture 51. When the SiC layer 6 is grown on the active region 21, methane ($CH_4$) reacts with a part of the $SiO_2$ layer 3, so that the part is deoxidized, causing defects that degrade the insulating characteristic of the $SiO_2$ layer 3. In particular, this reduction occurs in the ambient gas of $H_2$. Because of this, it has been very hard to realize a stable production of HBTs having planer structure with a wide energy band gap SiC emitter layer.

SUMMARY OF THE INVENTION

An object of the present invention is to realize a stable production of HBT having a wide energy band gap emitter made of SiC so as to have the excellent characteristics of HBTs, such as high current gain and high operation speed.

The above object is accomplished by applying a new method to the growing process of the wide energy band gap SiC emitter layer for affecting no influence to the $SiO_2$ layer of the HBT. The new method includes forming a protecting layer made of metal nitride or metal silicide on the $SiO_2$ layer for protecting the $SiO_2$ layer from being deoxidized by the reactant gas used in the growing process of the SiC layer, before an activation region for growing the wide energy band gap SiC emitter layer is formed. Because of forming the protecting layer is formed on the $SiO_2$ layer, the insulation characteristic of the $SiO_2$ layer becomes free from being damaged by the reactant gas during the CVD process, which results in realizing the stable production of HBT having the wide energy band gap emitter layer.

BRIEF DESCRIPTION OF THE DRAWINGS

FIG. 3(a) is a partial cross sectional view for illustrating a step for forming an aperture for providing a base region, to an Si substrate including a first $SiO_2$ layer;

FIG. 3(b) is a partial cross sectional view for illustrating a step for forming the base region;

FIG. 3(c) is a partial cross sectional view for illustrating a step for forming a second $SiO_2$ layer, on the base region and on the first $SiO_2$ layer and a step for forming a protection layer on the second $SiO_2$ layer;

FIG. 3(d) is a partial cross sectional view for illustrating a step for forming an aperture for providing an active region on the base region, passing through the protection layer and the second $SiO_2$ layer;

FIG. 3(e) is a partial cross sectional view for illustrating a step for forming an SiC layer on the active region and the protection layer;

FIG. 3(f) is a partial cross sectional view for illustrating a step for removing the SiC layer and the protection layer, leaving them in and around the aperture filled with the SiC layer;

FIG. 3(g) is a partial cross sectional view for illustrating a step for forming an aperture for forming a base electrode in the second silicon dioxide layer;

FIG. 3(h) is a partial cross sectional view for illustrating a step for forming the base electrode and an emitter electrode;

FIG. 4(a) is a partial cross sectional view for illustrating a step for forming an aperture for providing a base region, to an Si substrate including a first $SiO_2$ layer;

FIG. 4(b) is a partial cross sectional view for illustrating a step for forming the base region;

FIG. 4(c) is a partial cross sectional view for illustrating a step for forming a second SiO$_2$ layer on the base region and the first SiO$_2$ layer, and a step for forming a protection layer on the second SiO$_2$ layer;

FIG. 4(d) is a partial cross sectional view for illustrating a step for forming an aperture for forming an active region on the base region, passing through the protection layer and the second SiO$_2$ layer;

FIG. 4(e) is a partial cross sectional view for illustrating a step for forming an SiC layer on the active region and the protection layer;

FIG. 4(f) is a partial cross sectional view for illustrating a step for removing the SiC layer, leaving the the SiC layer in and around the aperture filled with the SiC layer;

FIG. 4(g) is a partial cross sectional view for illustrating a step for forming an aperture for forming a base electrode in the second SiO$_2$ layer;

FIG. 4(h) is a partial cross sectional view for illustrating a step for forming the base electrode and an emitter electrode;

FIGS. 5(a) and 5(b) are schematic partial cross sectional views for illustrating steps of the third embodiment of the present invention;

FIG. 5(a) is a partial cross sectional view for illustrating a step for forming a second SiO$_2$ layer on a base region and a first SiO$_2$ layer;

FIG. 5(b) is a partial cross sectional view for illustrating a step for forming a protection layer for a depth of the second SiO$_2$ layer from an upper surface of the second SiO$_2$ layer;

FIG. 6(a) is a partial cross sectional view for illustrating a step for forming a protection layer directly on a base region and a first SiO$_2$ layer; and FIG. 6(b) is a partial cross sectional view for illustrating a step for forming an aperture, in the protection layer, for providing an active region on the base region.

DESCRIPTION OF THE PREFERRED EMBODIMENTS

Figure 1:
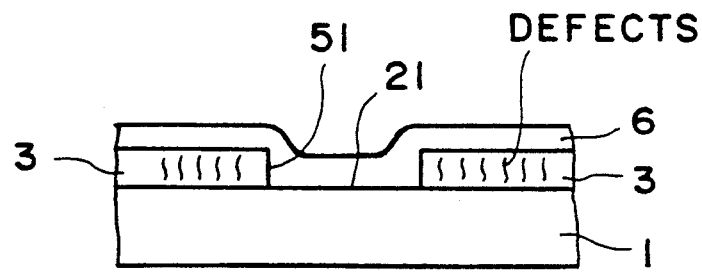
FIG. 1 is a schematic partially cross sectional view for illustrating a bipolar transistor, having a SiC layer for a wide energy band gap emitter, fabricated by the prior art method.
Figure 2:
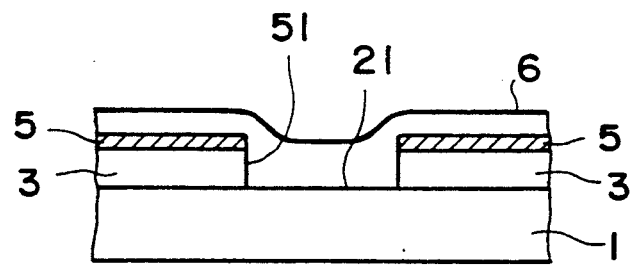
FIG. 2 is a schematic partially cross sectional view for illustrating a principle bipolar transistor having a protection layer between an $SiO_2$ layer and a SiC layer, fabricated by a method of the present invention.

FIG. 2 is a partial cross sectional view of a HBT for illustrating a principle of the present invention. In FIG. 2, the same reference numeral as in FIG. 1 designates the same layer, substrate or aperture as in FIG. 1. In FIG. 2, a protection layer 5 is formed on an SiO$_2$ layer 3 formed on an Si substrate 1 and an SiC layer 6 is grown on the protection layer 5 and an active region 21 formed by passing through the protection layer 5 and the SiO$_2$ layer 3. Since the protection layer 5 is formed on the SiO$_2$ layer 3, the SiO$_2$ layer 3 can be protected from being deoxidized due to the reactant gas used in forming the SiC layer 6. Therefore, the insulating characteristic of the SiO$_2$ layer 3 can be saved from being deoxidized. Because of providing the protection layer 5 to the HBT, stable production of LSI's including HBT's having the wide energy band gap SiC emitter can be realized.

A first embodiment of the present invention regarding a manufacturing method of a HBT having the wide energy band gap SiC emitter layer will be explained in reference to partial cross sectional views of FIGS. 3(a) to 3(h). In FIGS. 3(a) to 3(h), the same reference numeral as in FIG. 2 designates the same layer, substrate or aperture as in FIG. 2.

Figure 3A:
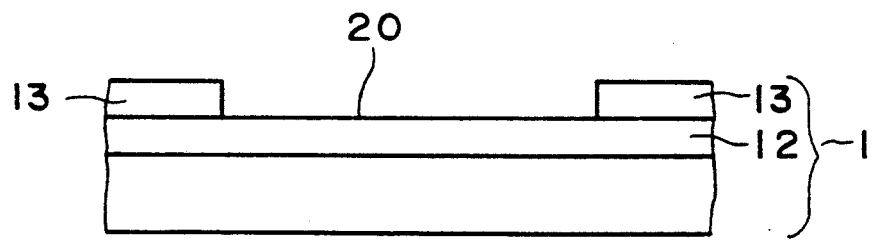
FIGS. 3(a) to 3(h) are schematic partially cross sectional views for illustrating fabricating steps of the first embodiment of the present invention.

In FIG. 3(a), an Si substrate 1 made by <111> oriented n$^+$-type Si is provided first, and an n-type Si layer 12, which is to be a collector region of the HBT, having 1 Ωcm resistivity is formed for a depth from the Si substrate 1 from the upper surface thereof, and an SiO$_2$ layer 13 is formed for a depth of 1 μm from the n-type Si layer 12 from the upper surface thereof by performing thermal oxidation to the Si substrate 1.

There is a case that an n-type layer and an SiO$_2$ layer are formed independently so as not to be formed from the Si substrate. However, in this embodiment, the n-type Si layer 12 and the SiO$_2$ layer 13 are formed from the Si substrate 1 as mentioned above, so that it is regarded that the n-type Si layer 12 and the SiO$_2$ layer 13 are the parts of the Si substrate 1 as indicated by reference numeral 1 in FIG. 3(a). After forming the SiO$_2$ layer 13, a region 20 for providing a base region 4, which will be shown in FIG. 3(b), is formed by etching the SiO$_2$ layer 13 so that an upper surface of the n-type silicon layer 12 is partially exposed in the region 20 as shown in FIG. 3(a).

Figure 3B:
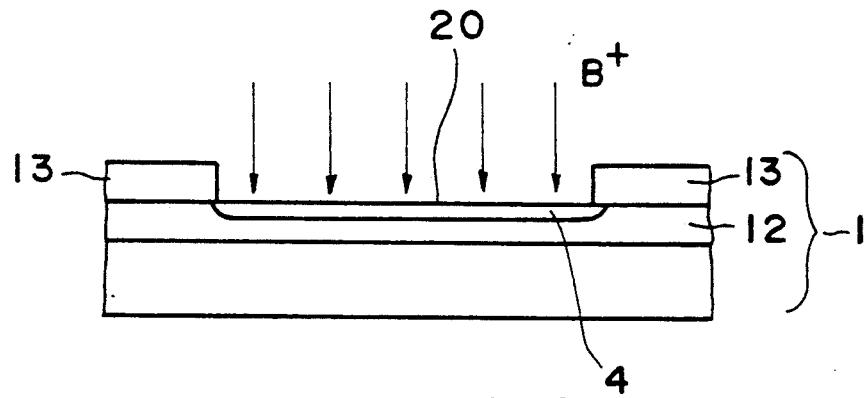

In FIG. 3(b), a p-type base region 4 is formed in the region 20 for a depth of 0.1 μm in the n-type Si layer 12 from the upper surface thereof, by ion (boron B$^+$) implantation performed so that the concentration of B$^+$ in the base region 4 becomes as much as $10^{17}$ cm$^{-3}$.

Figure 3C:
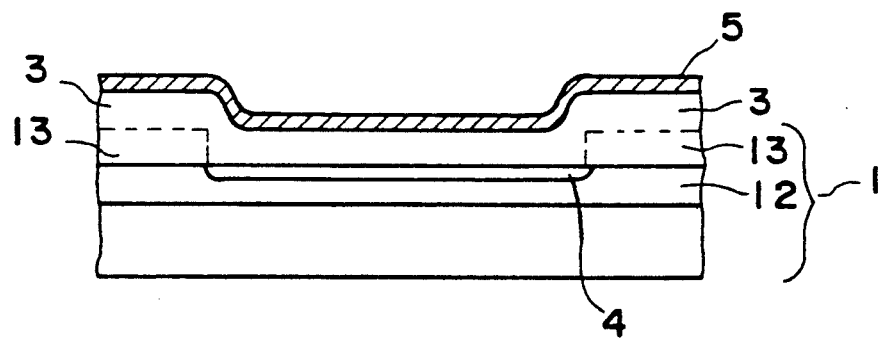

In FIG. 3(c), an SiO$_2$ layer 3 is formed on all upper surfaces of the SiO$_2$ layer 13 and the base region 4 by the CVD method, and a protection layer 5 made of titanium nitride is formed on the SiO$_2$ layer 3 as much as 0.1 μm in thickness by a usual sputtering method.

Figure 3D:
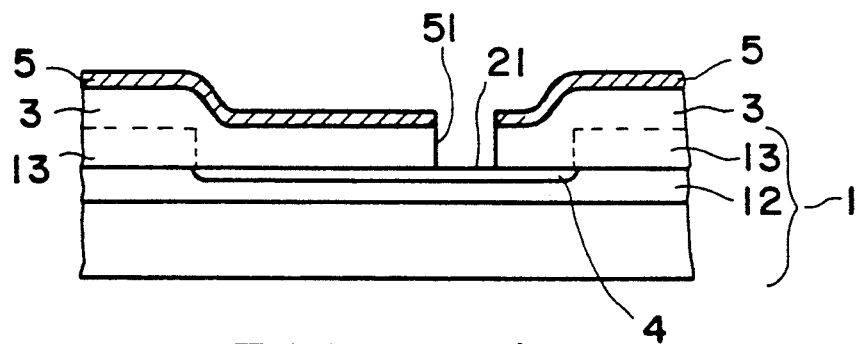

In FIG. 3(d), a resist pattern, not depicted in FIG. 3(d), having a resist aperture for forming a wide energy band gap emitter of the HBT is formed on the protection layer 5 so that the resist aperture is positioned above the base region 4, and an aperture 51 for providing an active region 21 to form the wide energy band gap emitter thereon is formed, passing through the protection layer 5 and the SiO$_2$ layer 3, by etching performed by using the resist pattern.

Figure 3E:
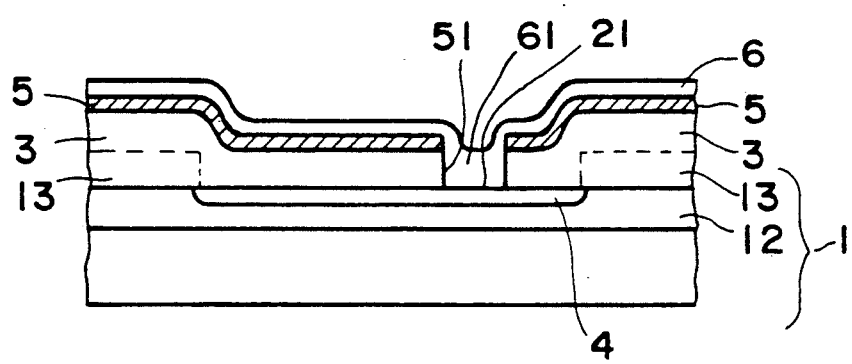

In FIG. 3(e), an SiC layer 6 is deposited on the active region 21 in the aperture 51 and the protection layer 6 in accordance with epitaxial growth carried out by the CVD method performed with a reactant gas consisting of trichlorosilane (SiHCl) and methane (CH$_4$). Hereupon, the SiC layer 6 deposited in and around the aperture 51 is partially transformed into an n-type SiC layer by doping phosphor for providing a wide energy band gap emitter region 61, and the rest of the SiC layer 6 deposited on the protection layer 5 is in the form of polycrystalline SiC.

Figure 3F:
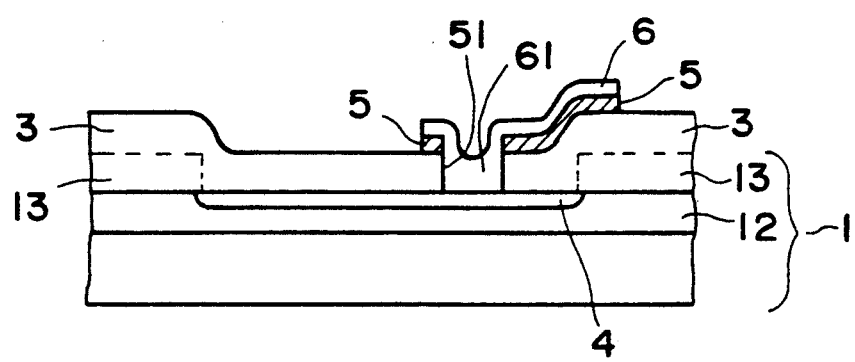

In FIG. 3(f), the SiC layer 6 formed on the protection layer 5 is removed by patterning, leaving the SiC layer 6 at and around the emitter region 61, and the protection layer 5 is removed by self aligning etching performed by using the remaining SiC layer 6, leaving the protection layer 5 underlying the remaining SiC layer 6.

Figure 3G:
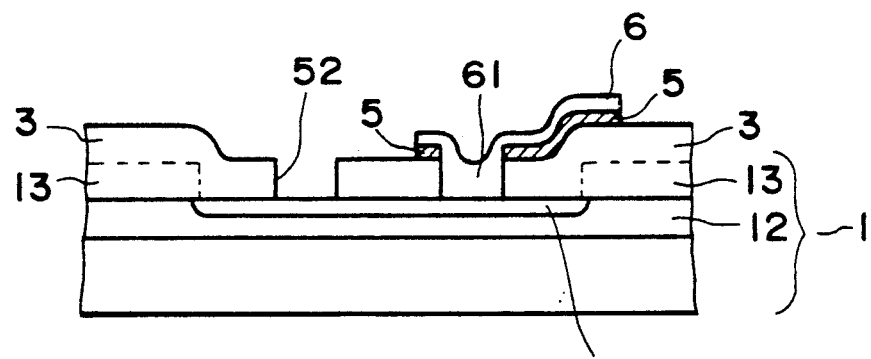

In FIG. 3(g), another aperture 52 for providing a base electrode of the HBT is formed, passing through the SiC layer 3 so that the aperture 52 is positioned on the base region 4 apart from the emitter region 61.

Figure 3H:
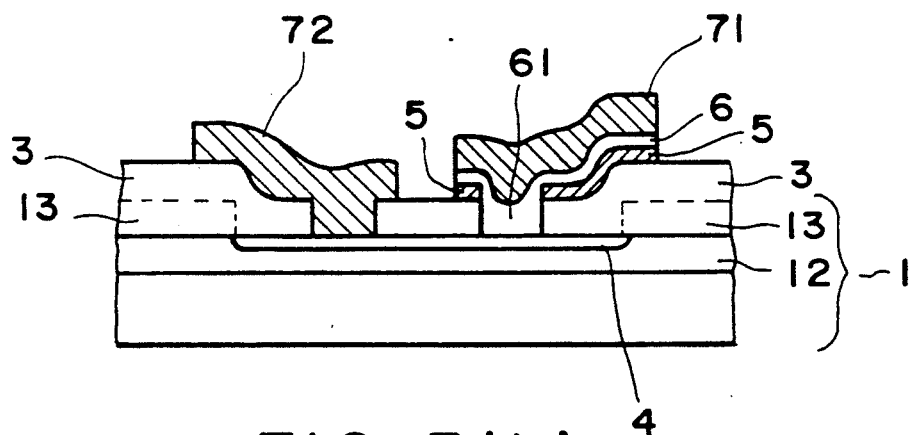

In FIG. 3(h), aluminum (Al) is evaporated on all the upper surface of subject in FIG. 3(g), and an emitter electrode 71 and a base electrode 72 are formed by patterning the evaporated Al.

In the first embodiment, the protection layer 5 is made of titanium nitride not reactive on the reactant gas used in forming the SiC layer 6, so that the SiO$_2$ layers 3 and 13 can be well protected from being deoxidized by the reactant gas.

In a bipolar transistor generally, a base resistance is lowered by increasing impurity concentration of the base, for obtaining high operation speed. However, when the impurity concentration is increased, current gain of the bipolar transistor is usually decreased. On the other hand, in the HBT of the first embodiment, the current gain does not decrease even though B$^+$ concentration of the base region 4 is increased as high as $10^{19}$ cm$^{-3}$. Furthermore, the HBT fabricated in accordance with the first embodiment has an excellent junction characteristic between the base region 4 and the emitter region 61. This is evident in that an "n" value of the HBT is 1.05, near to 1. Wherein, the "n" value is a current-voltage characteristic representing the junction quality of the bipolar transistor. The more the "n" value approaches 1, the more the junction quality becomes high. From this, it is concluded that because of introducing the first embodiment, stable production of the HBT can be realized, i.e., The HBT having a high quality SiC/Si heterojunction.

In the first embodiment, titanium nitride is applied as the protection layer 5, however, instead of that, nitride or silicide of a group IVb element being such as zirconium (Zr) or hafnium (Hf), a group Vb element being such as vanadium (V), niobium (Nb) or tantalum (Ta) or a group VIb element being such as chromium (Cr), molybdenum (Mo) or tungsten (W) can be used, and nitride or silicide of an element such as cobalt (Co), nickel (Ni) or aluminium (Al) also can be used to the protection layer 5.

A second embodiment of the present invention will be explained in reference to partial cross sectional views of FIGS. 4(a) to 4(h). In FIGS. 4(a) to 4(h), the same reference numeral as in FIGS. 3(a) to 3(h) designates the same layer, substrate or aperture as in FIGS. 3(a) to 3(h).

Figure 4A:
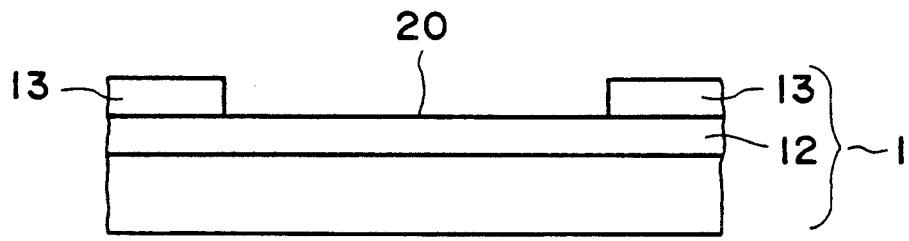
FIGS. 4(a) to 4(h) are schematic partial cross sectional views for illustrating steps of the second embodiment of the present invention.
Figure 4B:
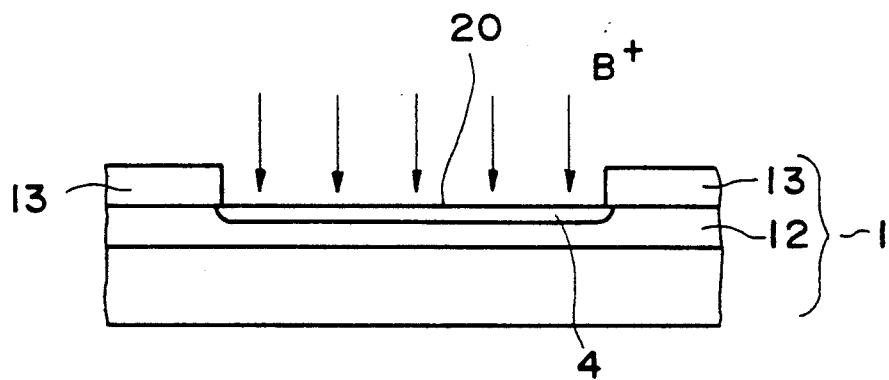

In FIGS. 4(a) and 4(b), the same fabricating processes as in FIGS. 3(a) and 3(b) are performed respectively.

Figure 4C:
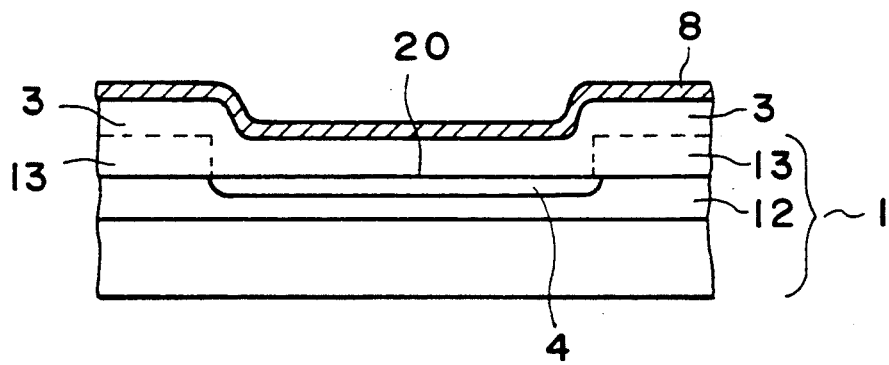

In FIG. 4(c), an SiO$_2$ layer 3 is formed on an upper surface of substance shown in FIG. 4(b) by the CVD method as much as 0.5 μm in thickness, and a protection layer 8 made of silicon nitride (Si$_3$N$_4$) is formed on the SiO$_2$ layer 3 as much as 0.1 μm in thickness by the CVD method performed in a gas consisting of ammonia (NH$_3$) and dichlorosilane (SiCl$_2$H$_2$).

Figure 4D:
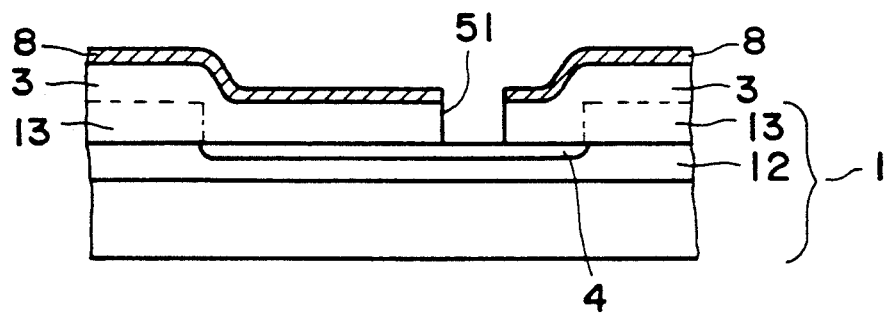

In FIG. 4(d), a resist pattern, not depicted in FIG. 4(d), having a resist aperture for forming a wide energy band gap emitter of the HBT is formed on the protection layer 8 so that the resist aperture is positioned above the base region 4, and an aperture 51 for providing an active region 21 to form the wide energy band gap emitter thereon is formed, passing through the protection layer 8 and the SiO$_2$ layer 3, by etching performed by using the resist pattern.

Figure 4E:
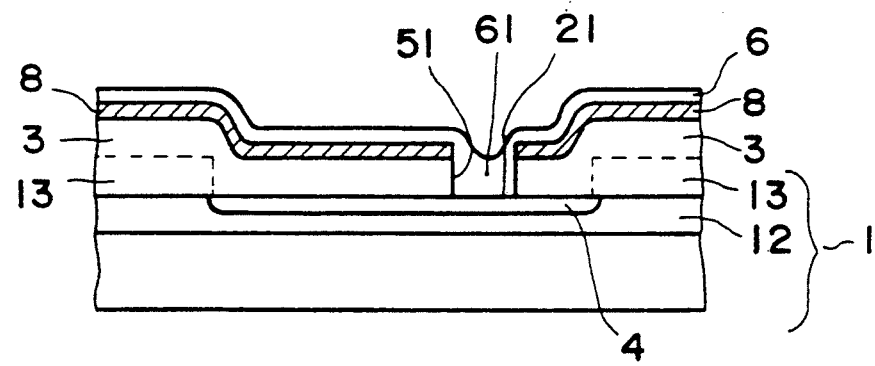

In FIG. 4(e), an SiC layer 6 is deposited on the active region 21 in the aperture 51 in accordance with epitaxial growth carried out by the CVD method performed with a reactant gas consisting of trichlorosilane (SiHCl$_3$) and methane (CH$_4$). Hereupon, the SiC layer 6 deposited in and around the aperture 51 is partially transformed into n-type SiC layer by doping phosphor for providing a wide energy gap emitter region 61, and the rest of the SiC layer 6 deposited on the protection layer 8 is in the form of polycrystalline SiC.

Figure 4F:
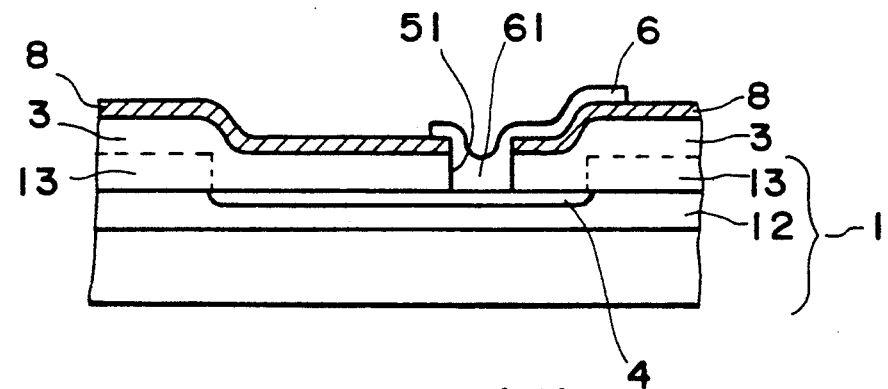

In FIG. 4(f), the SiC layer 6 partially removed by patterning, leaving the SiC layer 6 at and around the emitter region 61.

Figure 4G:
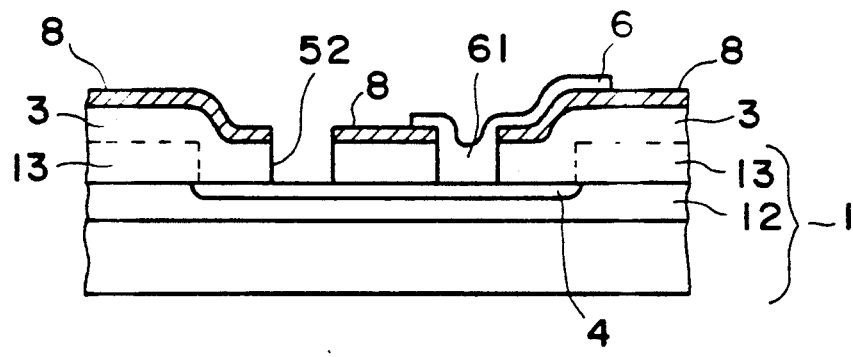

In FIG. 4(g), another aperture 52 for providing a base electrode of the HBT is formed, passing through the protection layer 8 and the SiC layer 3 so that the aperture 52 is positioned on the base region 4 apart from the emitter region 61.

Figure 4H:
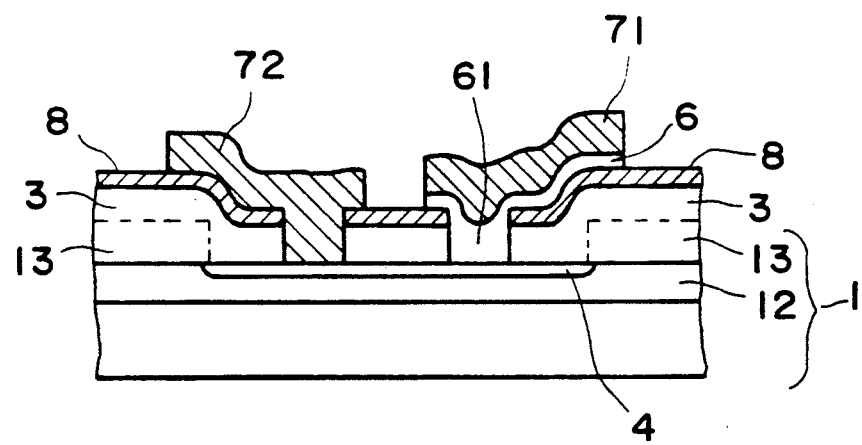

In FIG. 4(h), aluminum (Al) is evaporated on all the upper surface of substance in FIG. 4(g), and an emitter electrode 71 and a base electrode 72 are formed by patterning the evaporated Al.

Same as the first embodiment, in the second embodiment, the current gain of the HBT does not decrease even though the B$^+$ concentration of the base region 4 increases as high as $10^{19}$ cm$^{-3}$, and the HBT has the excellent junction characteristic between the base region 4 and the emitter region 61. The "n" value is 1.05, i.e., the same as that of the first embodiment. Thus, the excellent SiC/Si heterojunction formed by the first embodiment also can be formed by the second embodiment.

Figure 5A:
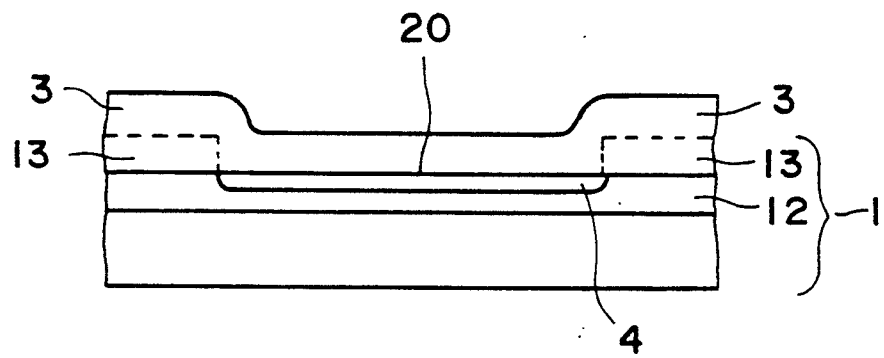
Figure 5A:
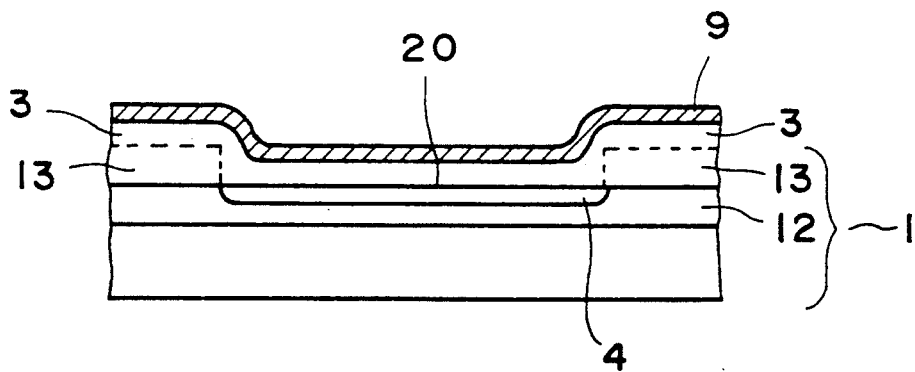

In the second embodiment, the protection layer 8 is made of Si$_3$N$_4$, however, a nitrided silicon oxide can be used instead of Si$_3$N$_4$. The step of forming the nitrided silicon oxide layer will be explained as a third embodiment of the present invention in reference to FIGS. 5(a) and 5(b). In FIGS. 5(a) and 5(b), the same reference numeral as in FIG. 4(c) designates the same layer or substrate as in FIG. 4(c).

In FIG. 5(a), the SiO$_2$ layer 3 is formed as much as 0.5 μm in thickness in the same way as explained in the second embodiment with reference to FIG. 4(c), and in FIG. 5(b), a nitrided silicon oxide layer 9 is formed for a depth of 10 nm in the SiO$_2$ layer 3 from the upper surface thereof by heating substance shown in FIG. 5(a) at approximately 1000° C. in an atmosphere of ammonia (NH$_3$) about 10 minutes.

In case of introducing the third embodiment, the same steps as in the second embodiment performed in reference to FIGS. 4(a) to 4(b) and FIGS. 4(d) to 4(h) are carried out before and after the steps explained in reference to Figs. 5(a) and 5(b), respectively.

Figure 6A:
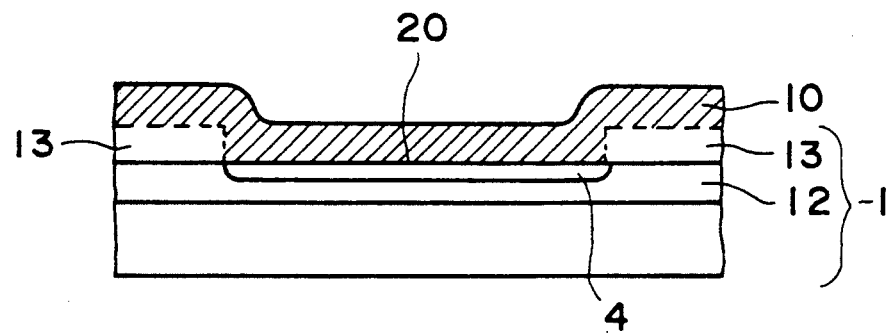
FIGS. 6(a) and 6(b) are schematic partial cross sectional views for illustrating steps of the fourth embodiment of the present invention.
Figure 6B:
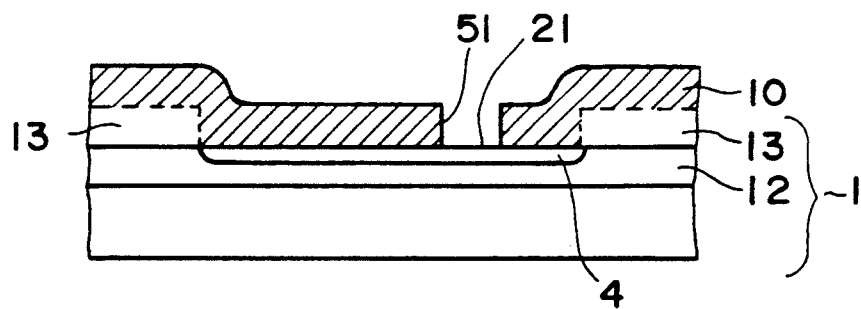

Another method of forming the protection layer will be explained as a fourth embodiment of the present invention in reference to FIGS. 6(a) and 6(b). In FIGS. 6(a) and 6(b), the same reference numeral as in FIGS. 4(c) and 4(d) designates the same layer, substrate, or aperture as in FIGS. 4(c) and 4(d). In the fourth embodiment, a silicon nitride (Si$_3$N$_4$) layer 10 is directly formed on the active region 20 and the SiO$_2$ layer 13 without forming an SiO$_2$ layer as done by the SiO$_2$ layer 3 in the second embodiment.

In FIG. 6(a), the protection layer 10 is formed as much as 0.5 μm in thickness by the CVD method, using ammonia (NH$_3$) and dichlorosilane (SiCl$_2$H$_2$), same as in the step explained in reference to FIG. 4(c) of the second embodiment.

In FIG. 6(b), same as in the step explained in the second embodiment with reference to FIG. 4(d), the aperture 51 for the wide energy band gap emitter is formed, passing through the protection layer 10, by etching.

In case of introducing the fourth embodiment, the same steps as in the second embodiment performed with reference to FIGS. 4(a) to 4(b) and FIGS. 4(e) to 4(h) are carried out respectively before and after the steps of the fourth embodiment.

What is claimed is:

1. A method for manufacturing a semiconductor device comprising a silicon substrate and a silicon carbide layer formed by chemical vapor deposition performed by using a reactant gas including a silicon source gas and a carbon source gas, said method comprising:
   forming a protection layer made of nitrided silicon oxide on the silicon substrate, wherein said protection layer is non-reactive with the reactant gas;
   forming an aperture for providing an active region on the silicon substrate, passing through said protection layer, so that said active region is exposed in said aperture; and
   forming the silicon carbide layer on said active region.

2. A method according to claim 1, wherein the reactant gas consists of trichlorosilane and methane.

3. A method according to claim 1, wherein said protection layer has a thickness of about 10 nm.

4. A method for manufacturing a semiconductor device comprising a silicon substrate, a silicon dioxide layer formed on the silicon substrate and a silicon carbide layer formed by chemical vapor deposition performed by using a reactant gas, said method comprising:
   forming a protection layer on the silicon dioxide layer, wherein said protection layer is non-reactive with the reactant gas, and wherein said protection layer is made of a material selected from a group consisting of titanium nitride, nitride or silicide of a group IVb element, nitride or silicide of a group Vb element, nitride or silicide of a group VIb element, nitride or silicide of cobalt, nitride or silicide of nickel, and nitride or silicide of aluminum.
   forming an aperture for providing an active region on the silicon substrate, passing through said protection layer and the silicon dioxide layer, so that said active region is exposed in said aperture; and
   forming the silicon carbide layer on said active region.

5. A method according to claim 4, wherein the step of forming said protection layer is performed by a sputtering method.

6. A method according to claim 5, wherein said sputtering method is carried out so that said protection layer has a thickness being as much as 0.1 μm.

7. A method according to claim 5, wherein the reactant gas consists of trichlorosilane and methane.

8. A method according to claim 4, wherein said protection layer is made of a material selected from the group consisting of nitride or silicide of zirconium, nitride or silicide of hafnium, nitride or silicide of vanadium, nitride or silicide of niobium, nitride or silicide of tantalum, nitride or silicide of chromium, nitride or silicide of molybdenum, and nitride or silicide of tungsten.

9. A method for manufacturing a semiconductor device comprising a silicon substrate and a silicon carbide layer formed by a chemical vapor deposition performed by using a reactant gas, said method comprising:
   forming a protection layer on the silicon substrate, wherein said protection layer is non-reactive with the reactant gas, and wherein said protection layer is made of a material selected from the group consisting of titanium nitride, nitride or silicide of a group IVb element, nitride of silicide of a group Vb element, nitride of silicide of a group VIb element, nitride or silicide of cobalt, nitride of silicide of nickel, and nitride or silicide of aluminum;
   forming an aperture for providing an active region on the silicon substrate, passing through said protection layer, so that said active region is exposed in said aperture; and
   forming the silicon carbide layer on said active region.

10. A method according to claim 8, wherein said protection layer is made of a material selected from the group consisting of nitride or silicide of zirconium, nitride or silicide of hafnium, nitride or silicide of vanadium, nitride or silicide of niobium, nitride or silicide of tantalum, nitride or silicide of chromium, nitride or silicide of molybdenum, and nitride or silicide of tungsten.

11. A method for manufacturing a semiconductor device comprising a silicon substrate, a silicon dioxide layer formed on the silicon substrate, and a silicon carbide layer formed by a chemical vapor deposition performed by using a reactant gas including a silicon source gas and a carbon source gas, said method comprising:
   forming a protection layer made of nitrided silicon oxide on the silicon dioxide layer, wherein said protection layer is non-reactive with the reactant gas;
   forming an aperture for providing an active region on the silicon substrate, passing through said protection layer and said silicon dioxide layer, so that said active region is exposed in said aperture; and
   forming the silicon carbide layer on said active region.

12. A method according to claim 10, wherein said step of forming said protection layer include the substep of:
   heating the silicon dioxide layer at approximately 1000° C. in an atmosphere of ammonia for about 10 minutes.

* * * * *